United States Patent
Kushnir

(10) Patent No.: US 10,917,051 B2
(45) Date of Patent: Feb. 9, 2021

(54) WIRELESS ARCHITECTURES AND DIGITAL PRE-DISTORTION (DPD) TECHNIQUES USING CLOSED LOOP FEEDBACK FOR PHASED ARRAY TRANSMITTERS

(71) Applicant: Intel Corporation, Santa Clara, CA (US)

(72) Inventor: Igal Kushnir, Hod-Hasharon (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/609,567

(22) PCT Filed: Jun. 30, 2017

(86) PCT No.: PCT/US2017/040265
§ 371 (c)(1),
(2) Date: Oct. 30, 2019

(87) PCT Pub. No.: WO2019/005101
PCT Pub. Date: Jan. 3, 2019

(65) Prior Publication Data
US 2020/0067466 A1 Feb. 27, 2020

(51) Int. Cl.
*H03F 1/32* (2006.01)
*H04B 1/04* (2006.01)
(Continued)

(52) U.S. Cl.
CPC ........... *H03F 1/3247* (2013.01); *H03F 3/245* (2013.01); *H04B 1/0475* (2013.01);
(Continued)

(58) Field of Classification Search
CPC .. H03F 1/3247; H03F 3/245; H03F 2200/451; H03F 2200/465;
(Continued)

(56) References Cited

U.S. PATENT DOCUMENTS

| 6,081,566 A * | 6/2000 | Molnar | H04B 7/0845 342/354 |
| 6,262,690 B1 * | 7/2001 | Malone | H01Q 21/245 333/101 |
| 8,331,946 B2 * | 12/2012 | Anreddy | H04B 7/0452 370/330 |
| 9,762,268 B2 * | 9/2017 | Yang | H04B 1/0007 |

(Continued)

OTHER PUBLICATIONS

International Search Report dated Feb. 26, 2018 for International Application No. PCT/US2017/040265.
(Continued)

*Primary Examiner* — Pablo N Tran
(74) *Attorney, Agent, or Firm* — 2SPL Patent Attorneys PartG mbB; Yong Beom Hwang

(57) ABSTRACT

Methods and architectures for closed loop digital pre-distortion (DPD) in a multi-stream phased array communication system include sampling outputs, from transmit antennas or dedicated analog detectors, of a plurality of RF power amplifiers operating in transmission of multi-stream transmission, correcting or normalizing the detected outputs, summing the outputs into a combined DPD feedback signal and selecting pre-distortion vectors to be used in altering the output of the PAs.

16 Claims, 9 Drawing Sheets

(51) Int. Cl.
*H04B 7/06* (2006.01)
*H03F 3/24* (2006.01)
*H01Q 3/26* (2006.01)
*H01Q 3/28* (2006.01)

(52) U.S. Cl.
CPC ..... *H04B 7/0615* (2013.01); *H03F 2200/451* (2013.01); *H03F 2200/465* (2013.01); *H03F 2201/3215* (2013.01); *H03F 2201/3227* (2013.01); *H03F 2201/3233* (2013.01); *H03F 2203/21142* (2013.01); *H03F 2203/21163* (2013.01); *H04B 2001/0425* (2013.01)

(58) Field of Classification Search
CPC ..... H03F 2201/3215; H03F 2201/3227; H03F 2201/3233; H03F 2203/21142; H03F 2203/21163; H03F 1/32; H04B 1/0475; H04B 7/0615; H04B 2001/0425; H04B 1/04; H01Q 3/26; H01Q 3/28; H01Q 21/06
See application file for complete search history.

(56) References Cited

U.S. PATENT DOCUMENTS

| | | | | |
|---|---|---|---|---|
| 10,070,453 | B2* | 9/2018 | Inoue | H04W 72/044 |
| 2007/0010198 | A1* | 1/2007 | McKay, Sr. | H04B 7/10 |
| | | | | 455/10 |
| 2008/0049868 | A1* | 2/2008 | Brobston | H03F 1/3247 |
| | | | | 375/297 |
| 2010/0001904 | A1* | 1/2010 | Iwamatsu | H01Q 3/2611 |
| | | | | 342/372 |
| 2010/0166109 | A1 | 7/2010 | Neumann et al. | |
| 2010/0254299 | A1 | 10/2010 | Kenington | |
| 2011/0235749 | A1 | 9/2011 | Kenington | |
| 2014/0050282 | A1* | 2/2014 | Watanabe | H03F 1/3247 |
| | | | | 375/296 |
| 2018/0053997 | A1* | 2/2018 | Noto | H01Q 3/2617 |
| 2019/0289606 | A1* | 9/2019 | Negus | H04B 7/15 |
| 2019/0319364 | A1* | 10/2019 | Yang | H01Q 1/2283 |

OTHER PUBLICATIONS

International Preliminary Report on Patentability dated Dec. 13, 2019 for International Application No. PCT/US2017/040265.

* cited by examiner

200

```
┌─────────────────────────────────────────────────────────────────────┐
│ Sampling a power amplified (PA) signal from outputs of each power amplifier │
│    of a plurality of amplifiers operating in a multi-stream transmit mode │
│ 202                                                                 │
└─────────────────────────────────────────────────────────────────────┘
                                    │
                                    ▼
┌─────────────────────────────────────────────────────────────────────┐
│    Combining/summing/scaling the sampled outputs into single digital │
│              pre-distortion (DPD) feedback signal                    │
│ 203                                                                  │
└─────────────────────────────────────────────────────────────────────┘
                                    │
                                    ▼
┌─────────────────────────────────────────────────────────────────────┐
│              Communicating the DPD feedback signal                   │
│ 204       to a digital processing unit in a baseband module          │
└─────────────────────────────────────────────────────────────────────┘
                                    │
                                    ▼
┌─────────────────────────────────────────────────────────────────────┐
│ Selecting by the digital processing unit, a digital pre-distortion (DPD) │
│ input signal, for linearization of the power amplifiers based on the DPD │
│ 206                        feedback signal                               │
└─────────────────────────────────────────────────────────────────────┘
                                    │
                                    ▼
┌─────────────────────────────────────────────────────────────────────┐
│  Applying the selected DPD input signal to inputs of the respective  │
│   power amplifiers that were sampled to provide the DPD feedback     │
│ 208                           signal                                 │
└─────────────────────────────────────────────────────────────────────┘
                                    │
                                    ▼
┌─────────────────────────────────────────────────────────────────────┐
│   Repeat steps 202-208 periodically or when performance threshold    │
│                           exceeded                                   │
│ 210                                                                  │
└─────────────────────────────────────────────────────────────────────┘
```

Fig. 2a

Normal operation mode TX or RX

TX "ON" & RX is used as part of DPD Feedback

WIRELESS ARCHITECTURES AND DIGITAL PRE-DISTORTION (DPD) TECHNIQUES USING CLOSED LOOP FEEDBACK FOR PHASED ARRAY TRANSMITTERS

This application is a National Phase entry application of International Patent Application No. PCT/US2017/040265 filed Jun. 30, 2017 entitled "WIRELESS ARCHITECTURES AND DIGITAL PRE-DISTORTION (DPD) TECHNIQUES USING CLOSED LOOP FEEDBACK FOR PHASED ARRAY TRANSMITTERS" in the name of Igal Kushnir and is hereby incorporated by reference in its entirety.

FIELD

Embodiments of the present invention relate generally to wireless communications, and more particularly, but not limited to, improving efficiencies of power consumption in wireless devices having multiple input and/or multiple output transmit/receive chains using detected feedback for digital pre-distortion (DPD) linearization of power amplifiers.

BACKGROUND

Pre-distortion is a technique used to improve the linearity of radio power amplifiers (PAs). Much work has been done over many decades to improve PAs amplification characteristics to be "linear" so that they accurately reproduce the signal present at their input for output transmission after amplification. An amplifier that compresses its input signal or has a non-linear input/output relationship causes the output signal produce inter-modulation (IM) products that fall inband, degrading the transmitted signal quality (EVM—error vector magnitude) and cause splatter onto adjacent radio frequencies and causes unwanted interference on other radio channels.

Pre-distortion techniques have been used in the analog and digital domains for the purpose of inversely modeling the amplifier's gain and phase characteristics and, when combined with the amplifier input, produces an overall system that is more linear and reduces the amplifier's distortion. In essence, "inverse distortion" is introduced into the input of the amplifier, thereby reducing the non-linearity of the amplifier. In modern architectures, at increased frequencies, e.g., 60 GHz, using multiple adjacent subcarriers like in orthogonal frequency division multiplexing (OFDM) with multiple xmit/rcv chains and antennas, and the never-ending need to reduce power consumption for increased mobile battery life, digital pre-distortion, rather than analog circuits, has become a desirable technique for reducing device power consumption and PA linearization.

BRIEF DESCRIPTION OF THE DRAWINGS

Certain circuits, logic operation, apparatuses and/or methods will be described by way of non-limiting example only, in reference to the appended Drawing Figures in which:

FIG. 2a shows a wireless communication method 200 for closed loop digital pre-distortion, according to one example aspect of the disclosure utilizing phased array system with dual polarizations;

DETAILED DESCRIPTION

A 5G mm-Wave phased-array transmitter consumes high power due to PA low efficiency at such high frequency. The high output power required renders it difficult to implement effective and efficient digital pre-distortion (DPD) for PA linearization using known techniques.

Merely by way of example, a 5G 39 GHz front end test chip on a 28 nm die, each PA consumes ~260 mW. If the transmitter operates 4-8 PAs concurrently, TX power consumption is in the range of ~1-2 Watts. It is desirable to improve that power consumption as much as in half.

Embodiments of the present invention progress toward that goal by implementing various techniques to provide fast real time high quality PA DPD with a closed loop architecture as explained in certain examples herein.

Figure 1:
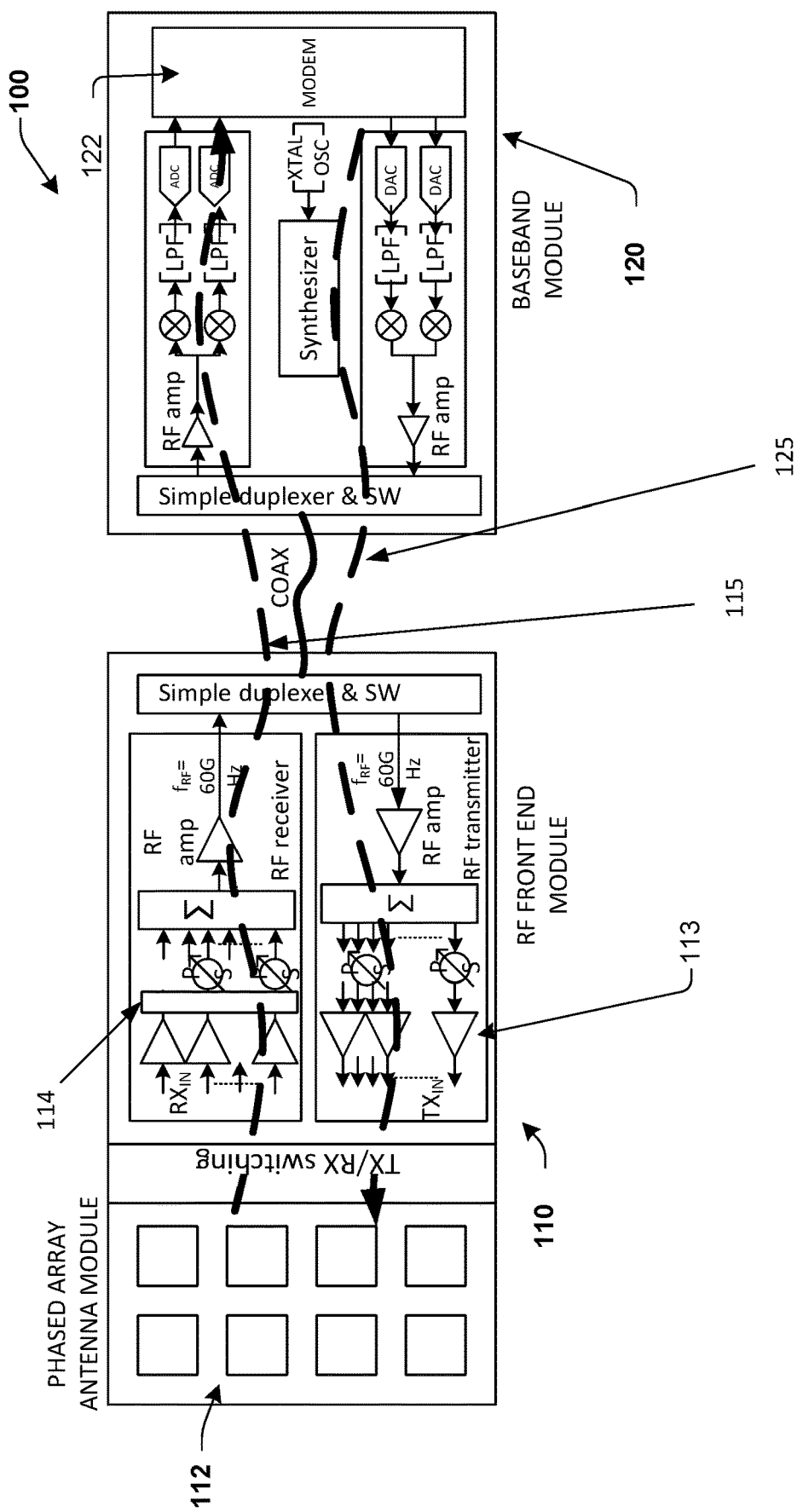
FIG. 1 shows a simplified block diagram of an example generalized communication system 100 of an example embodiment of the invention with closed loop digital pre-distortion (DPD)

Referring to FIG. 1, a wireless communication device 100 according to one embodiment may include a phased array radio frequency (RF) front end module (FEM) 110 and/or a baseband processing module 120. In certain, non-limiting implementations, RF FEM 110 may include necessary analog components for transmission and, optionally, reception of, multi-stream RF signals operating in the 10+ GHz frequency range, generically referred to herein at 60 GHz though not limited to that specific frequency range.

RF FEM 110 may include, or be coupled, via an antenna port, to a phased array antenna module 112 which includes a plurality of antennas for simultaneous or "diversity" transmissions of the same signal or independent multiple output signals, referred to herein as multi-stream transmissions. And, if desired, receiving multi-stream RF signals similarly. In this example embodiment, each transmission antenna to its own transmit chain having supporting RF components like RF amplifiers, mixers, oscillators, frequency synthesizers, analog to digital converters (ADCs)/digital to analog converters (DACs), attenuators, frequency filters, phase locked loops (PLLs), low noise amplifiers (LNAs), etc. as selected by one of skill in the art for its intended purpose. Notwithstanding, each transmit chain will necessarily include its own radio frequency (RF) power amplifier (PA) 113. As discussed previously, based on the 10+ GHz frequencies used in transmission and the need for power amplifiers 113 to perform efficiently, effectively and with low power consumption, it is desirable to implement digital pre-distortion architectures and methods of the inventive embodiments. As generally depicted by dashed lines in the example communication device 100 of FIG. 1, a closed loop feedback sampling of power amplifiers 113 is sampled, the power levels of each sampled PA are preferably calibrated to eliminate mismatches, summed by a feedback combiner 114 and fed back from RFFEM module 110 to processing module 120, e.g. a modem circuit 122 in baseband module (or M-module) 120 via a feedback signal 115. Such signal may be provided via an RF port connector and passed over a coaxial cable by way of example. Processing unit 120 may then calculate a desired DPD for all the active PAs 113 and return the magnitude and phase corrections for pre-distorting the PAs 113 transmitting through the phased array antenna module 112 via return DPD signal 125 from baseband module 120 on a real-time or near real-time basis, and/or on a periodically optimized or as desired basis. In actuality, the DPD signals calculated or selected by processing unit 120 may just be appended or added to the data signal to be amplified by each PA. Thus, as used in this example, the data signal to be amplified, but represented in digital domain, may be modified by the DPD selection all within processing unit 120, although for ease of understanding, the DPD is illustratively referred to herein as being applied to the input of the respective PA being "pre-distorted."

In this manner, digital pre-distortion of amplifiers 113 can be performed in a "closed-loop" fashion to account for changes in thermal variances, voltage variations, amplifiers mismatches and non-ideality, frequencies used, and/or any device, use or surrounding environment effect that may have an impact on consistent, linear and near uniform matched operation of power amplifiers 113.

Thus, the example system 100 as shown in FIG. 1, and now referring to FIG. 2, may generally operate by a method 200 of transmitting in a communication system using closed-loop digital pre-distortion, including: detecting or sampling 202, a power amplified (PA) signal from outputs of each power amplifier of a plurality of amplifiers operating in a multi-stream transmit mode; compensating for mismatch of the different sampling paths (from each PA) combining or summing 203 the sampled PA output signals into a single digital pre-distortion (DPD) feedback signal, and communicating or feeding back 204 the summed DPD feedback signal back to a digital processing unit 120 through an RF port or RF interface, such as a coaxial connector, to a processing unit 122. In various embodiments, combining 203 may include scaling the DPD feedback signal to compensate for mismatches between different branches of phased array 122.

In the baseband module 120; calculating the required parameters for the DPD from the sampled signals, for example by calculation or by look up table or the like, by the digital processing unit 122 executing instructional code, a digital pre-distortion (DPD) signal based on the detected PA output signals; and applying 208 the DPD signal to all of the active PAs sending TX signals to the phased array of antennas. The same signal is applied to all active PAs such that a high quality error vector magnitude (EVM) is obtained. This is ensured due to the DPD feedback signaling being done on combined PAs signals as seen in the far field.

In general, below is an expression for the summed-up TX power and intermodulation power at the output of the phased array transmitted (note, in general this is far field as would be seen by the receiver at the other edge of the link):

$$P_{TX} = \sum_{K} \left( P_{TX\_chain_K} + \sum_{n} IM_{n_K} \right)$$

The values shown for TX Power (P) here have (K) number of transmitters (with mismatches between them, for example, gain mismatch and linearity mismatch (P1dB, Psat)). In each TX chain there are (n) components generating intermodulation products (IM). Therefore, The DPD operation and correction of the DPD algorithm is performed based on the summed expression.

Steps 202-208 can be done in real time continuously (e.g. closed loop DPD) or may be repeated 210 as often as desired, as conditions change or as pre-determined thresholds for device performance have been reached, such as power consumption, detected interference, pre-set periods or any reason to believe performance characteristics of power amplification may have changed or need adapting.

Figure 2B:
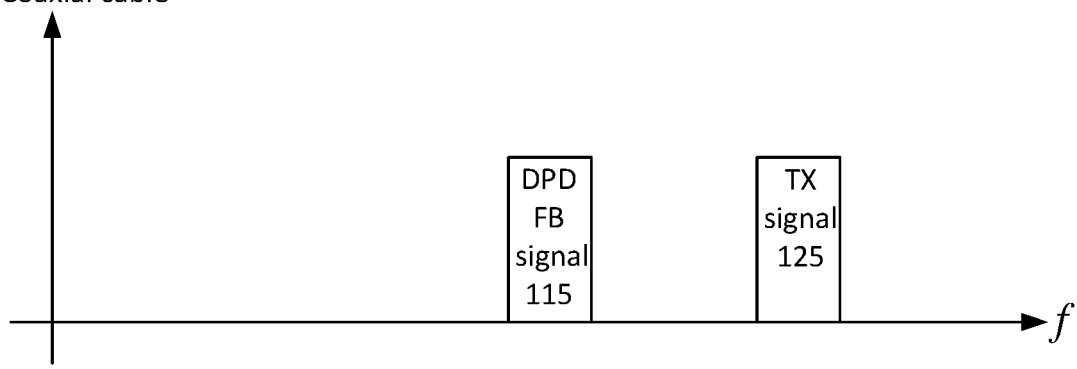
FIGS. 2b and 2c show frequency characteristics of transmit signals and DPD feedback signals passed over a coaxial connection for two different embodiments utilizing dual polarized antennas.
Figure 2C:
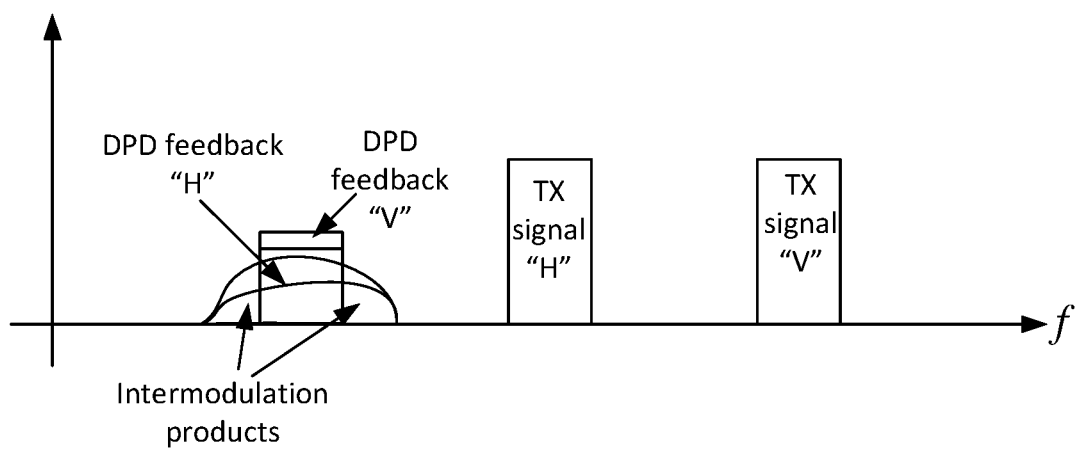

FIGS. 2b and 2c show example frequency characteristics of the respective spectral content passed over embodiments connecting the RFFEM 110 and Modem Module 120 via a coaxial cable: FIG. 2b in the case where a dual polarized antenna is only active transmitting in one of the vertical or horizontal polarizations and FIG. 2c, in the case where both horizontal and vertical (H & V) polarizations are actively transmitting, as explained in greater detail in example embodiments below.

Figure 3A:
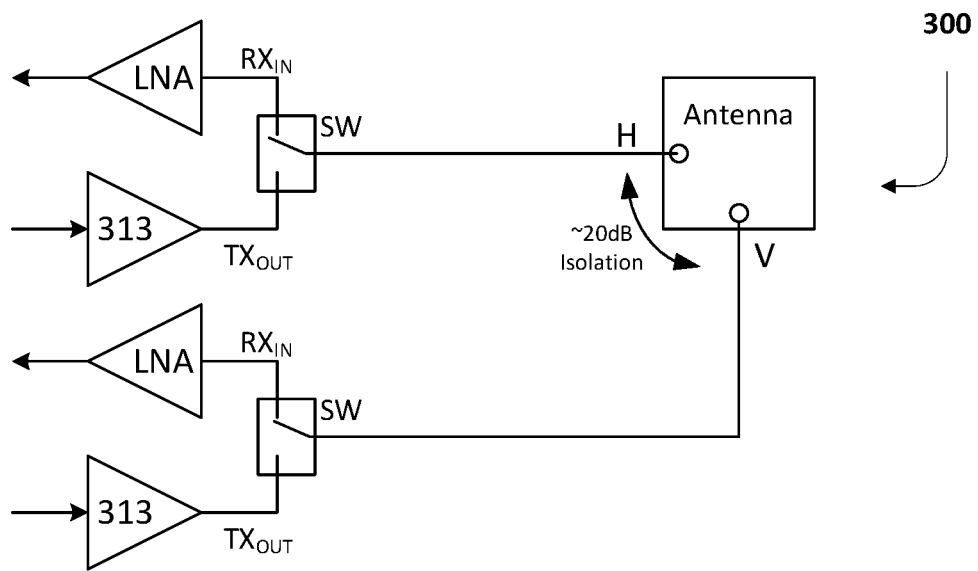
FIGS. 3a and 3b show simplified example implementations of a wireless device 300 including a digital pre-distortion detection circuit with dual polarized antennas of a phased array example of the inventive embodiments.
Figure 3B:
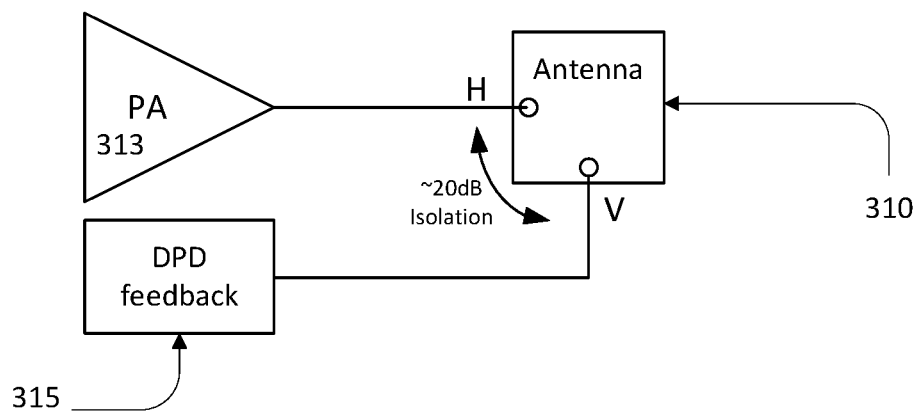

Referring to FIGS. 3a and 3b, one optional implementation of certain embodiments suited for a specific platform include a communication device 300 utilizing multiple dual polarized antennas 310 (only 1 is shown in FIGS. 3a and 3b for simplification). In such an embodiment, a plurality of dual polarization or dual positional antennas, e.g., horizontal (H) and vertical (V) 310 may be used wherein the detecting output of transmission PA comprises using dual polarization antennas, a first polarization for transmitting and a second polarization for receiving, and wherein detecting comprises using the receiving polarization, not simultaneously being used while transmitting (FIG. 3a), for detecting the power amplified signal from the transmitting polarization of the same dual polarization antenna (FIG. 3b).

This is one of the simplest implementations possible because while the antenna loss due to polarity is different, for example a −20 db loss between horizontal and vertical paths, it is generally known and the signal path to and from the same antenna is virtually identical. Therefore, detection of the PA output for transmission on the horizontal polarization of the antenna can be very accurately detected at the same antenna receive path by the vertical polarization, or vice versa, which leads to more effective DPD feedback 315 and PA linearization. The sampled powers from each PA output might be affected by system mismatches in the antenna (isolation between V & H) and feedback path up to the power combiner. These mismatches are preferably calibrated and eliminated before the power combining.

Figure 4:
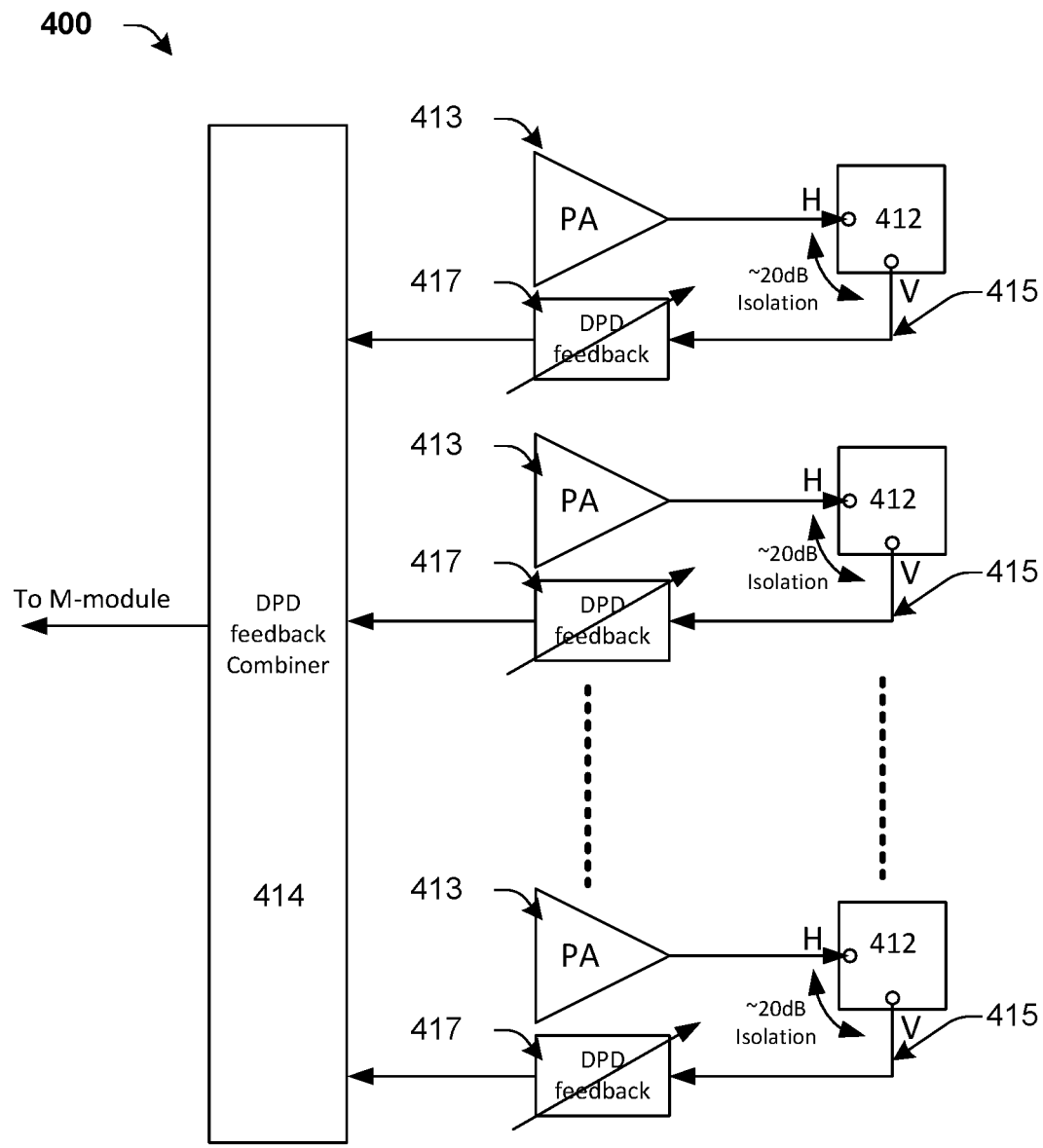
FIG. 4 shows a wireless communication system 400 including dual polarized antenna for closed loop digital pre-distortion and attenuator, according to one embodiment of the disclosure.

Turning to FIG. 4, a communication device 400 is shown according to certain embodiments, where an isolation exists between the vertical and horizontal polarizations of antennas 412, for example −20dB. As mentioned previously, it is desirable to accurately represent true output of PAs 413 for DPD detection, summing and correction of PAs 413 output via input of digital pre-distortion. Thus, in this example embodiment, sampling output of PAs 413 via using, e.g., the vertical polarization of dual polarization antennas 412, it may be desirable to include a DPD feedback variable attenuator 417 in the DPD feedback path 415 to allow mismatch calibration of V & H isolation between the different antennas. The DPD feedback with attenuation may then be summed or combined based on the representational equation previously mentioned, and scaled, if desired and sent or communicated to the baseband processor (also interchangeably referred to herein as "M module" or Modem module) for digital pre-distortion of signal inputs to power amplifiers 413 individually.

Figure 5:
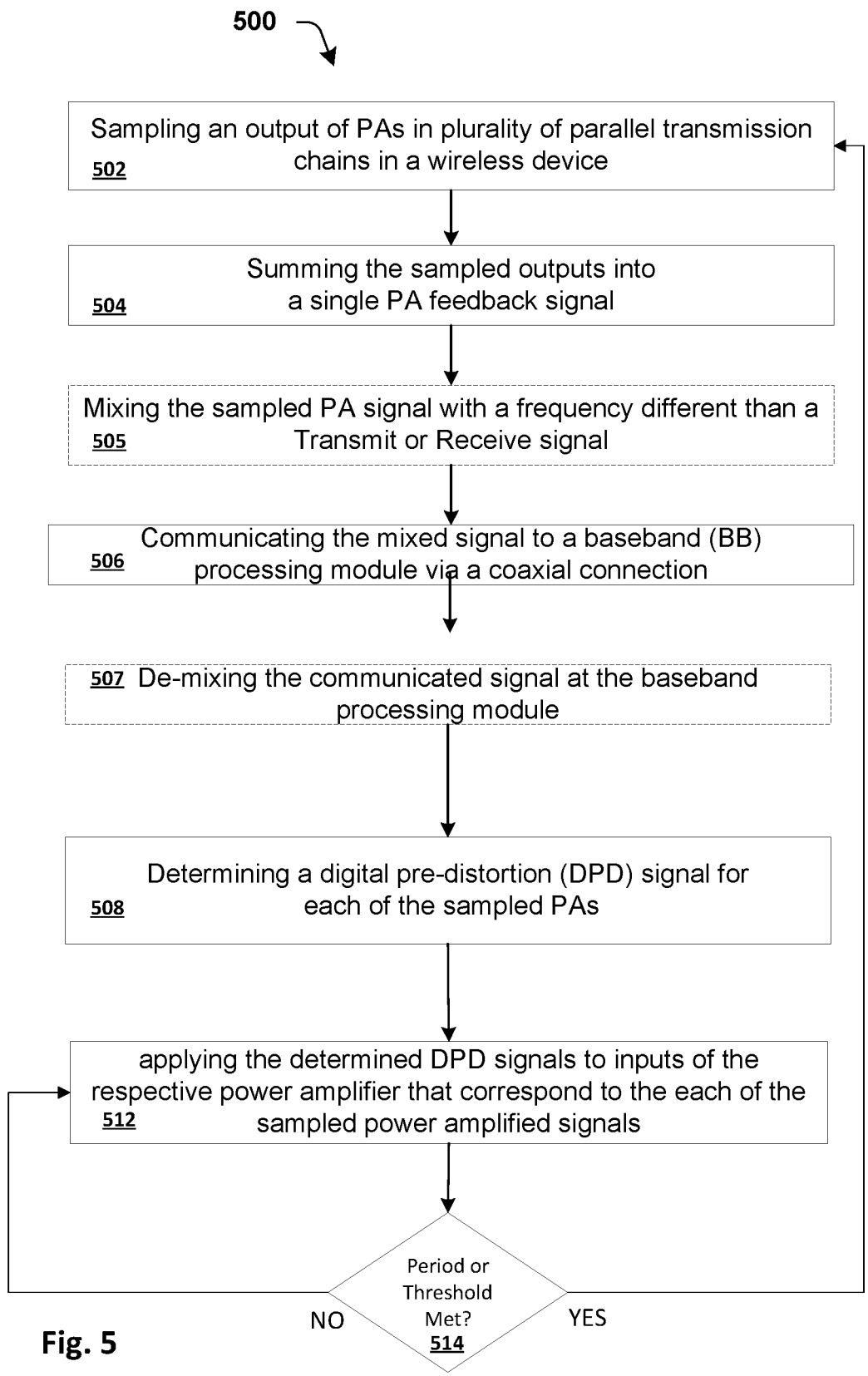
FIG. 5 shows an example method 500 of wireless communication including a digital pre-distortion feedback circuit, according to another embodiment of the disclosure.

In certain embodiments, referring to FIGS. 1 and 5, the radio frequency (RF) front end module (RFFEM) includes a port to couple to the M module by way of coaxial connection. Therefore, according to a method 500 for this configuration, a plurality of PA outputs are sampled 502 ("detected" or "captured" may also be interchangeably used herein as they are analog signals, not digital sampling, at least until ADC conversion in the M module before processing), summed/combined 504 as previously discussed in other embodiments. However, because receive and transmit interference may be encountered along coaxial connection between RFFEM and BB modules 110, 120, it may be desirable to mix 505 the combined DPD feedback signal onto a different frequency set and then de-mix using components already located on both modules 110, 120. For example, over a single coax cable we can expect to have the TX signal at $(f)_{Tx}$ (transmission frequency) and the DPD feedback at a different frequency $(f)_{DPD}$. FIG. 2b shows illustrative representation in this case.

These frequencies can have a common ratio or be a fraction one from the other, for example $(f)_{DPD}=\frac{2}{3}(f)_{Tx}$ this is used when the generation of these two frequencies is done from a common synthesizer. This allows a system architect to utilize an existing circuitry and frequency plan over the coaxial connection. Merely by way of another specific example embodiment, in a 5G 28 GHz, 39 GHz or 60 GHz system of the type mentioned previously, or taught by the Wireless Gigabit Alliance ("WiGig"), two TX streams of "V" and "H" may be simultaneously transmitted over the two different polarizations/orientations of each dual polarized antenna. When only one data stream is used for transmission, the DPD feedback may be performed using the circuitry and frequency of the other non-used data stream.

In the 5G case where both "V" and "H" are able to be used the DPD feedback can pass on the same frequency the DPD feedbacks of the V & H and the DPD algorithm in the processing unit can use this data to perform independent DPD correction on V and H paths (the V and H signals are independent and uncorrelated, so the needed information can be recovered). In the circumstance M-module and the RFFEM are connected with two coaxial cables, one for V and the other for H, when only one data stream is active in TX mode the second coaxial connection can pass to the RFFEM the DPD feedback information freely without mixing the feedback signal. In this case, when both data streams are active, the DPD feedback can be passed over the same coaxial cables but at a different frequency as mentioned above.

If a frequency convergence of the DPD feedback is needed, a local oscillator (LO) signal must be used to drive the mixer (for up or down for frequency convergence), such a LO can be generated in the RFFEM 110 by a dedicated synthesizer (not shown) or passed as an LO signal over the coaxial connection(s). Emphasis being, those of skill in the art, depending on the platform they are working with, can fairly easily provide a feedback path that does not interfere with primary functions of the transceiver using the closed loop DPD methods and architectures of the inventive embodiments.

In FIG. 5 embodiment, the mixed DPD feedback signal is then communicated 506 via coaxial connection, demixed 507 and processed into digital representation for baseband processor to determine 508 the proper digital pre-distortion to apply 512 to each transmit path and perform the PA linearization intended. As mentioned previously, determine may mean either calculate or simply look up from a memory what pre-distortion magnitude and phase corrections to apply based on the closed loop DPD feedback signal detected. At step 514, the DPD detection and correction may be repeated as conditions change or periodically or for any threshold reached as desired by a system architect.

Figure 6:
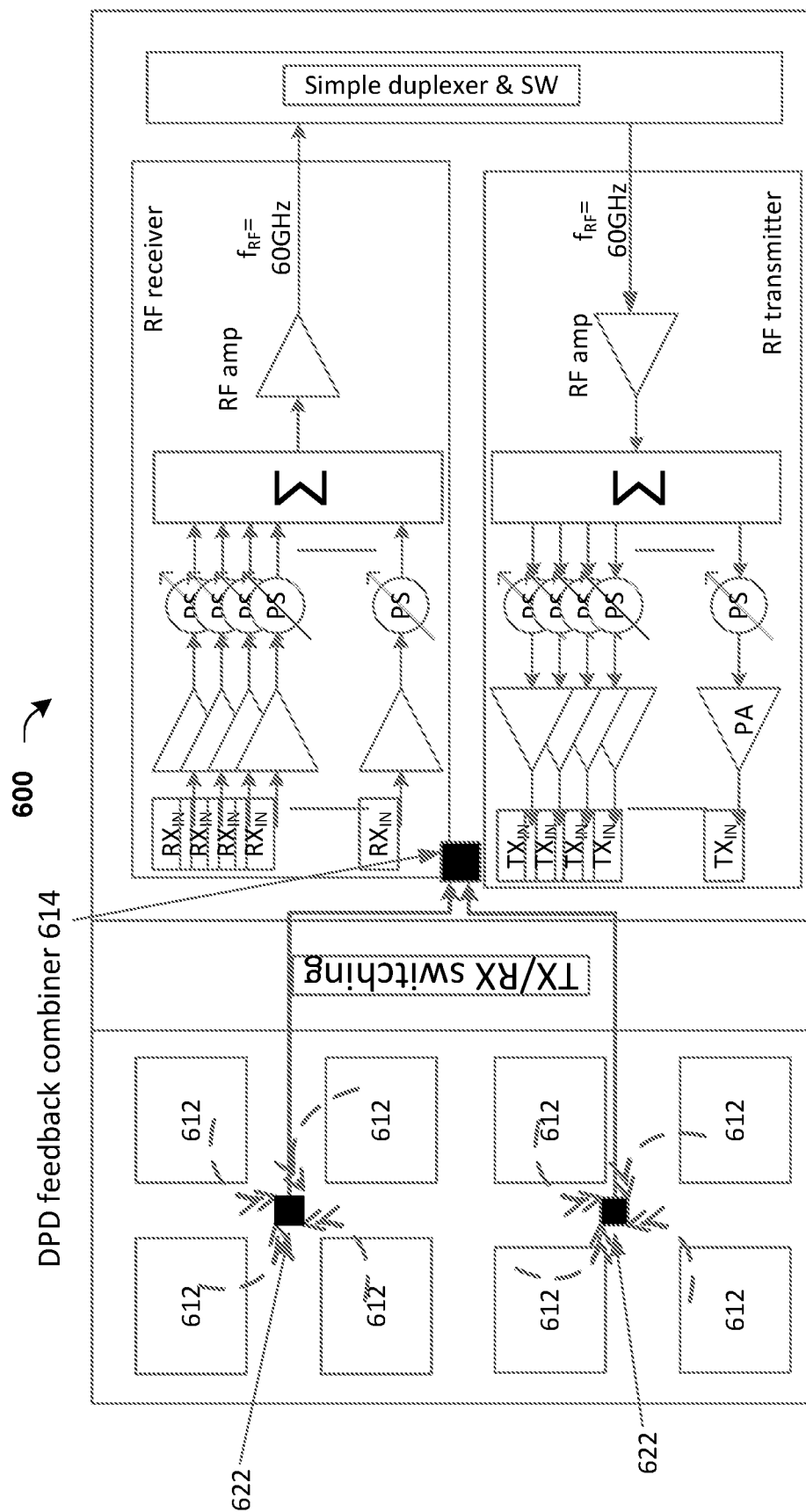
FIG. 6 shows an example implementation of wireless communication device 600 including a DPD feedback circuit with dedicated analog detectors, according to additional embodiments of the disclosure.

There are instances and applications where dual orientation/polarization antennas are not used, and/or the vertical and horizontal polarizations may be committed for data transmission and/or reception simultaneously. In these instances, referring to FIG. 6, a communication device 600 is illustrated as previous embodiments, but instead of using the dual polarization antennas for detection as described in alternate embodiments, device 600 may include additional analog DPD feedback detection mechanisms, such as DPD feedback antennas 622 proximate the phased array transmit/receive antennas 612. This embodiment may introduce more error into the DPD feedback signal, which when combined by combiner 630 may increase the error without some error reduction circuitry included. Notwithstanding, such error reduction, refection, loss or differences may be determined and calibrated out as much as possible during on line operation or design and manufacture stages to effectively detect multiple PA transmit signals in parallel and provide the closed loop DPD feedback similar to embodiments previously discussed.

Figure 7:
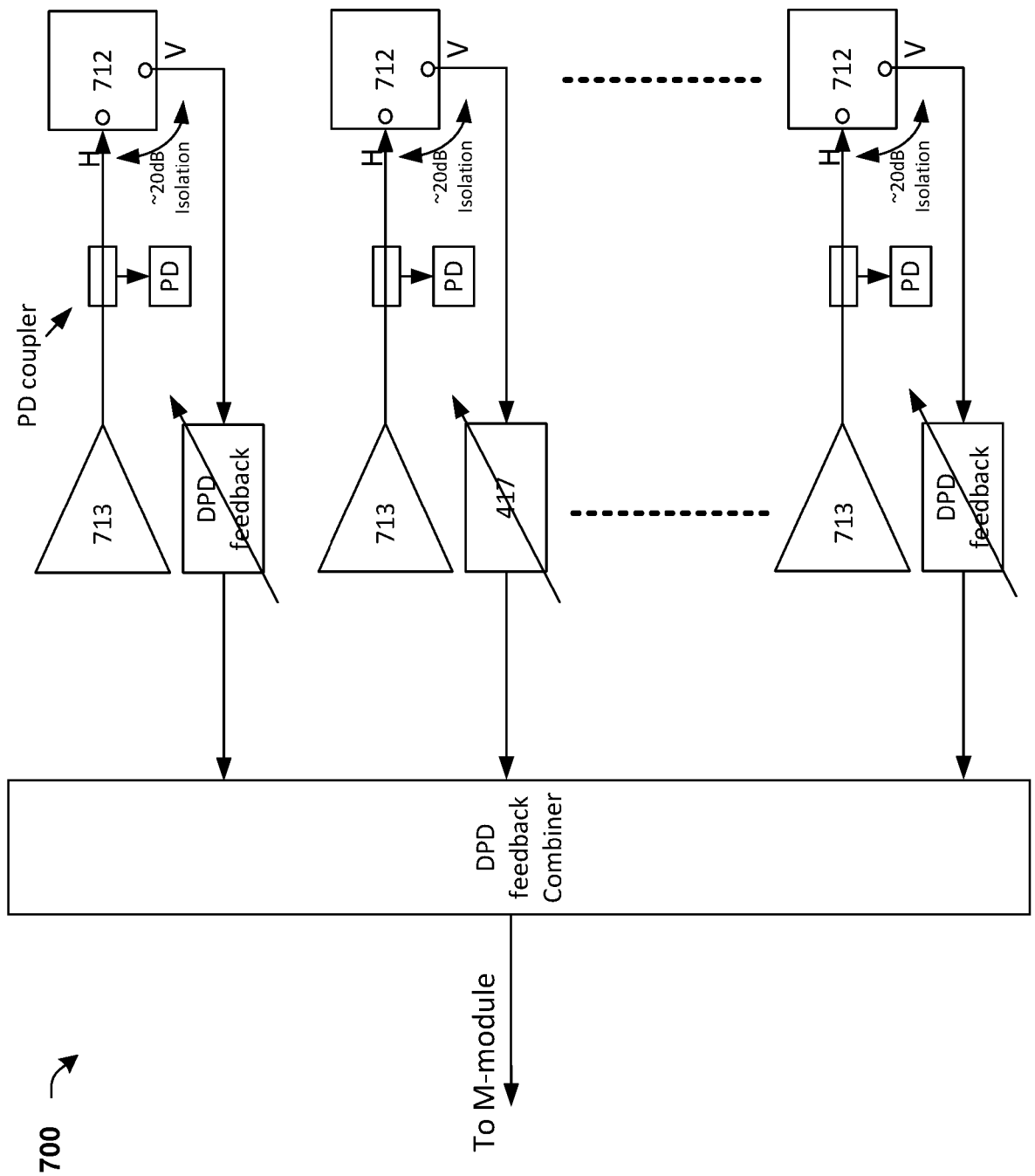
FIG. 7 shows an example implementation of wireless communication device 700 including a DPD feedback circuit with power detector (PD), couplers and feedback attenuators, according to additional embodiments of the disclosure.

Referring to FIG. 7, a communication device 700 may include BOTH the DPD feedback from dual polarization antennas 712 and DPD attenuator 717 as in prior embodiments as well as a power detector (PD) and coupler 740 to detect actual loss between output of PAs 713 and detected transmit signals over the vertical (or horizontal) polarization of antennas 712 so that DPD attenuator 717 may be accurately tuned to reintroduce the full magnitude lost by phased array V & H isolation mismatch between different antennas.

It should be recognized that various of the inventive embodiments may be used in providing closed loop DPD feedback to support multiple RFFEMs and/or a massive antenna array (MAA) as desired for linearization of PAs utilized in those applications.

Figure 8:
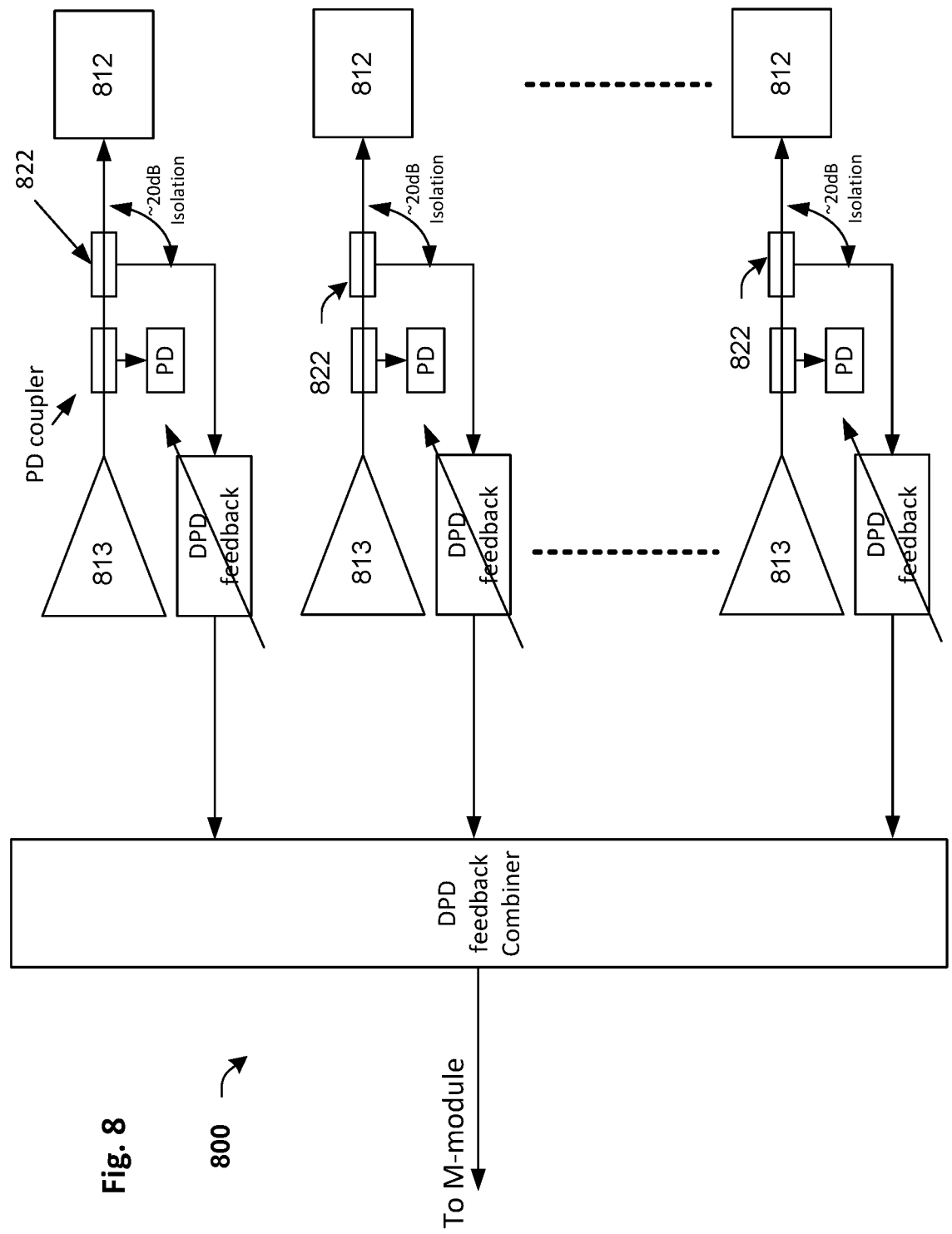
FIG. 8 shows an example implementation of wireless communication device 800 including a DPD feedback circuit with dedicated analog detectors in the form of power detectors (PD), couplers, according to yet other embodiments of the disclosure.

Additionally, in certain embodiments, where dual polarized/oriented antenna are not present or respective polarizations are not able to be used for real time DPD feedback, an analog detector in the form of DPD coupler coupled to the output of each active transmit PA may be used instead as shown in FIG. 8. As with all embodiments, the parallel sampling of PA outputs are calibrated (mismatch compensation), summed, potentially scaled, optionally mixed to send over coaxial connection, and sent to the baseband or M module for digital processing and applying up to date, efficient and effective digital pre-distortion for all transmit chains concurrently (nearly simultaneously). Those of skill in the art would recognize modifications and substitutions of the elements, components and circuits described herein and possible and the invention is not limited to the specific examples in the detailed description but rather by the appended claims.

Examples of inventive embodiments:

In an Example 1, a wireless communication device comprises a radio frequency (RF) front end module that comprises a plurality radio frequency (RF) power amplifiers (PAs) configured to amplify a plurality of signals to be transmitted simultaneously in parallel, and a digital pre-distortion (DPD) feedback circuit configured to feedback samples of the PAs outputs. The DPD feedback circuit comprises a combiner to combine a plurality of PAs outputs detected in parallel into a single combined DPD feedback signal.

In an Example 2, the wireless communication device of Example 1 further comprises a mixer adapted to mix the combined DPD feedback signal at a frequency dedicated for DPD feedback, and a coaxial coupler to communicate the mixed combined DPD feedback signal to a provided baseband processing module when connected to the coaxial coupler.

In an Example 3 that is based on either Example 1 or 2, the wireless communication device further comprises an antenna port configured to couple the RF front end module to a phased array of dual polarized antennas, the dual polarized antennas each having a horizontal polarization and a vertical polarization. The DPD feedback circuit feeds back samples of the PAs outputs detected by one of the horizontal or vertical polarizations of the dual polarized antennas not used for transmitting.

In an Example 4 that is based on either Example 1 or 2, the wireless communication device further includes an antenna port configured to couple the RF front end circuit to a phased array of dual polarized antennas each antenna having a horizontal polarization and a vertical polarization, and a feedback line of the DPD feedback circuit coupled to the antenna port. The feedback line provides samples of the PAs outputs on a receive path from one of the horizontal or vertical polarizations of each of the dual polarized antennas not used for transmitting, when the phased array is connected to the antenna port.

In an Example 5 that is based on either Example 1 or 2, the wireless communication device further includes a phased array of dual polarized antennas coupled to the outputs of the PAs of the RF front end circuit, wherein the dual polarized antennas each having a horizontal polarization and a vertical polarization. The DPD feedback circuit feeds back samples of the PAs outputs detected by one of the horizontal or vertical polarizations of the dual polarized antennas not used for transmitting.

In an Example 6 that is based on any of Examples 3-5, the wireless communication device further comprises the phased array of dual polarized antennas coupled to the antenna port.

In an Example 7 that is based on Example 6, the DPD feedback circuit further comprises an attenuator at each receive path of the array of dual polarized antennas before the combiner, the attenuator to normalize losses due to isolation between the horizontal polarization and vertical polarization of each dual polarized antenna in the phased array.

In an Example 8 that is based on any of Examples 1-7, the DPD feedback circuit further comprises a power detector (PD) coupled to an output of each of the plurality of PAs outputs, wherein the PD provides the plurality of PA outputs for combining by the combiner.

In an Example 9 that is based on any of Examples 1-8, the wireless communication device further comprises a digital processor module coupled to the RF front end module that is configured to receive the combined DPD feedback signal and select digital pre-distortion correction signals to input into of each of the plurality of PAs in the RF front end module for which the combined DPD feedback signal was obtained.

In an Example 10 that is based on any of Examples 1-9, the wireless communication device further comprises an antenna port configured to couple to a plurality of diversity antennas used for transmitting data. The antenna port includes a detection link to receive samples of each antennas transmission characteristics via a dedicated DPD antenna detectors co-located and proximate sub groups of the plurality of diversity antennas, and the detection link is used as input for the DPD feedback circuit.

In an Example 11 that is based on any of Examples 1-8, the wireless communication device further includes a coaxial cable, and a digital processor circuit coupled to the RF front end circuit by the coaxial cable. The digital processor circuit is configured to receive the combined DPD feedback signal and select digital pre-distortion correction signals to pre-distort each of the plurality of PAs in the RF front end module for which the combined DPD feedback signal was obtained.

In an Example 12 that is based on any of Examples 1-11, the frequencies of transmission of the wireless communication device are in excess of 10 GHz.

In an Example 13, a wireless communication device is disclosed and comprises a radio frequency (RF) front end module (FEM) port connector, and a baseband processing module coupled to the RF FEM port connector. The baseband processing module is configured to receive a digital pre-distortion (DPD) feedback signal via the RF FEM port connector, the DPD feedback signal comprises a summed plurality of detected output samples of a plurality of radio frequency (RF) power amplifiers (PAs) used for simultaneous multi-stream transmissions, and the baseband processing module includes a processing circuit configured to, based on the received DPD feedback signal, select digital pre-distortion signals for pre-distorting each of said plurality of RF PAs.

In an Example 14 that is based on Example 13, the wireless communication device further comprises an RF front end coupled to the baseband processing module via the RF FEM port connector, the RF front end including the plurality of RF PAs, and a DPD feedback circuit to provide the DPD feedback signal to the baseband processing module via the RF FEM port connector.

In an Example 15 that is based on Example 14, the wireless communication device further comprises a phased array of dual polarized antennas coupled to the RF front end and outputs of the plurality of RF Pas. The detected output samples are detected by a polarization of each antenna of the phased array of dual polarized antennas, not being used for transmission.

In an Example 16 that is based on Example 15, the RF FEM port connector comprises a coaxial connector and wherein frequencies of transmission of the wireless communication device are in excess of 10 GHz.

In an Example 17 that is based on Example 16, the DPD feedback circuit comprises an attenuator for each of the plurality of RF PAs to normalize isolation loss between polarizations of each of the dual polarized antennas, and a combiner to sum the detected output samples of the plurality of RF PAs into the DPD feedback signal after attenuation.

In an Example 18 that is based on Example 16, the DPD feedback circuit comprises an attenuator for each of the plurality of RF PAs to normalize isolation loss between polarizations of each of the dual polarized antennas or other mismatches between receive chains, and a combiner to sum the detected output samples of the plurality of RF PAs into the DPD feedback signal after attenuation.

In an Example 19 that is based on any of Examples 15-17, the dual polarization antennas in the phased array each include a horizontal polarization for transmission and a vertical polarization for sampling one of each the detected output samples combined into the DPD feedback signal.

In an Example 20, a method for wireless communication is disclosed, and comprises detecting a power amplified (PA) signal from outputs of each power amplifier (PA) of a plurality of amplifiers (PAs) operating in a multi-stream transmit mode, and combining the detected PA signals into a single digital pre-distortion (DPD) feedback signal. The method further comprises communicating the combined single DPD feedback signal to a digital processing unit, selecting a magnitude and phase correction for pre-distorting each of the power amplifiers based on the single combined DPD feedback signal, and applying the selected magnitude and phase corrections to each PA relevant to the combined single DPD feedback signal.

In an Example 21 based on Example 20, a dual polarized antenna is coupled to an output of each PA, the dual polarized antenna having a first polarization for transmitting each PAs output signal, and a second polarization for receiving. The detecting comprises using the second polarization for receiving to detect the power amplified signal transmitted from the first polarization for transmitting on the same dual polarized antenna.

In an Example 22 that is based on either Example 20 or 21, the detecting comprises using a dedicated DPD analog detector to sample the output signals of each of the plurality of PAs for combining.

In an Example 23 that is based on Example 22, the dedicated DPD analog detector comprises a dedicated antenna proximate transmitting antennas.

In an Example 24 that is based on Example 22, the dedicated DPD analog detector comprises a power detector (PD) coupled to the outputs of the PAs operating in the multi-stream transmit mode, and an attenuator to calibrate mismatch, if any, from the coupled PD path from each PA.

In an Example 25 that is based on Example 20, the communicating the combined DPD feedback signal to the digital processing unit comprises mixing the combined DPD feedback signal at a frequency other than a data transmit or receive frequency, and transmitting the mixed DPD feedback signal over a coaxial connection to a baseband processing module.

In an Example 26 a system for wireless communication using simultaneous multi-stream transmissions from a plurality of transmit chains is disclosed. The wireless communication system includes a phased array of dual polarized antennas, each antenna having a vertical polarization and a horizontal polarization, and a radio frequency (RF) front end circuit coupled to the phased array, the RF front end circuit including a plurality of RF power amplifiers (PAs), one PA for each transmit chain, and a digital pre-distortion (DPD) feedback circuit to provide a DPD feedback signal comprising a summed total of detected outputs of each of the plurality of PAs used in transmitting. The system further comprises a baseband processing circuit coupled to the RF front end circuit and configured to provide data signals to each transmit chain in the RF front end circuit and a selected pre-distortion signal to pre-distort each of the plurality of PAs based on the DPD feedback signal, and a coaxial cable to couple the RF front end circuit to the baseband processing circuit.

In an Example 27, a method for wireless communication is disclosed. The method comprises detecting a power amplified (PA) signal from outputs of each power amplifier (PA) of a plurality of amplifiers (PAs) operating in a multi-stream transmit mode, and combining the detected PA signals into a single digital pre-distortion (DPD) feedback signal. The method further comprises selecting a magnitude and phase correction for pre-distorting each of the power amplifiers based on the single combined DPD feedback signal, and applying the selected magnitude and phase corrections to each PA relevant to the combined single DPD feedback signal.

In an Example 28 that is based on Example 27, detecting is performed by a dual polarized antenna coupled to an output of each PA, the dual polarized antenna having a first polarization for transmitting each PAs output signal, and a second polarization for receiving the transmitting of the first polarization to detect the power amplified signal on the same dual polarized antenna.

In an Example 29 that is based on Example 27, the detecting is performed using a dedicated DPD analog detector to sample the output signals of each of the plurality of PAs for combining and wherein the dedicated DPD analog detector comprises one of a dedicated antenna proximate transmitting antennas or a power detector (PD) coupled to the outputs of the PAs operating in the multi-stream transmit mode.

In an Example 30 that is based on any of Examples 27-29, the method further includes attenuating detected outputs of the PAs to calibrate mismatch, if any, from respective receive paths or antenna isolations prior to combining.

In an Example 31 that is based on any of Examples 27-30, the method further includes communicating the combined DPD feedback signal to a digital processing unit by mixing the combined DPD feedback signal at a frequency other than a data transmit or receive frequency, and transmitting the mixed DPD feedback signal over a coaxial connection to the digital processing unit.

Disclaimer: The present disclosure has been described with reference to the attached drawing figures, with certain example terms and wherein like reference numerals are used to refer to like elements throughout. The illustrated structures, devices and methods are not intended to be drawn to scale, or as any specific circuit or any in any way other than as functional block diagrams to illustrate certain features, advantages and enabling disclosure of the inventive embodiments and their illustration and description is not intended to be limiting in any manner in respect to the appended claims that follow, with the exception of 35 USC 112, first paragraph claims using the literal words "means for," if present in a claim. As utilized herein, the terms "component," "system," "interface," "logic," "circuit," "device," and the like are intended only to refer to a basic functional entity such as hardware, software (e.g., in execution), logic (circuits or programmable), firmware alone or in combination to suit the claimed functionalities. For example, a component, module, device or processing unit may mean a microprocessor, a controller, a programmable logic array and/or a circuit coupled thereto or other logic processing device, and a method or process may mean instructions running on a processor, firmware programmed in a controller, an object, an executable, a program, a storage device including instructions to be executed, a computer, a tablet PC and/or a mobile phone with a processing device. By way of illustration, a process, logic, method or module can be any analog circuit, digital processing circuit or combination thereof. One or more circuits or modules can reside within a process, and a module can be localized as a physical circuit, a programmable array, a processor. Furthermore, elements, circuits, components, modules and processes/methods may be hardware or software, combined with a processor, executable from various computer readable storage media having executable instructions and/or data stored thereon. Those of ordinary skill in the art will recognize various ways to implement the logical descriptions of the appended claims and their interpretation should not be limited to any example or enabling description, depiction or layout described above, in the abstract or in the drawing figures.

What is claimed is:

1. A wireless communication device comprising:
   a radio frequency (RF) front end module comprising:
      a plurality radio frequency (RF) power amplifiers (PAs) configured to amplify a plurality of signals to be transmitted simultaneously in parallel; and
      a digital pre-distortion (DPD) feedback circuit configured to feedback samples of the PAs outputs, wherein the DPD feedback circuit comprises a combiner to combine a plurality of PAs outputs detected in parallel into a single combined DPD feedback signal; and
   an antenna port configured to couple the RF front end module to a phased array of dual polarized antennas, the dual polarized antennas each having a horizontal polarization and a vertical polarization, wherein the DPD feedback circuit feeds back samples of the PAs outputs detected by one of the horizontal or vertical polarizations of the dual polarized antennas not used for transmitting.

2. The wireless communication device of claim 1, further comprising:
   a mixer adapted to mix the combined DPD feedback signal at a frequency dedicated for DPD feedback; and
   a coaxial coupler to communicate the mixed combined DPD feedback signal to a provided baseband processing module when connected to the coaxial coupler.

3. The wireless communication device of claim 1, further comprising the phased array of dual polarized antennas coupled to the antenna port.

4. The wireless communication device of claim 3, wherein the DPD feedback circuit further comprises an attenuator at each receive path of the array of dual polarized antennas before the combiner, the attenuator to normalize losses due to isolation between the horizontal polarization and vertical polarization of each dual polarized antenna in the phased array.

5. The wireless communication device of claim 1, wherein the DPD feedback circuit further comprises a power detector (PD) coupled to an output of each of the plurality of PAs outputs, said PD to provide the plurality of PA outputs for combining by the combiner.

6. The wireless communication device of claim 1, further comprising:
   a digital processor module coupled to the RF front end module, and configured to receive the combined DPD feedback signal and select digital pre-distortion correction signals to input into of each of the plurality of PAs in the RF front end module for which the combined DPD feedback signal was obtained.

7. The wireless communication device of claim 1, further comprising:
   an antenna port configured to couple to a plurality of diversity antennas used for transmitting data,
   wherein the antenna port includes a detection link to receive samples of each antennas transmission characteristics via a dedicated DPD antenna detectors co-located and proximate sub groups of the plurality of diversity antennas, and
   wherein the detection link is used as input for the DPD feedback circuit.

8. A wireless communication device, comprising:
   a radio frequency (RF) front end module (FEM) port connector; and
   a baseband processing module coupled to the RF FEM port connector,
   wherein the baseband processing module is configured to receive a digital pre-distortion (DPD) feedback signal via the RF FEM port connector, the DPD feedback signal comprising a summed plurality of detected output samples of a plurality of radio frequency (RF) power amplifiers (PAs) used for simultaneous multi-stream transmissions, and
   wherein the baseband processing module includes a processing circuit configured to, based on the received DPD feedback signal, select digital pre-distortion signals for pre-distorting each of said plurality of RF PAs,
   wherein the wireless communication device further comprises:
   an RF front end coupled to the baseband processing module via the RF FEM port connector, the RF front end including the plurality of RF PAs;
   a DPD feedback circuit to provide the DPD feedback signal to the baseband processing module via the RF FEM port connector; and
   a phased array of dual polarized antennas coupled to the RF front end and outputs of the plurality of RF PAs,
   wherein the detected output samples are detected by a polarization of each antenna of the phased array of dual polarized antennas, not being used for transmission.

9. The wireless communication device of claim 8, wherein the RF FEM port connector comprises a coaxial connector and wherein frequencies of transmission of the wireless communication device are in excess of 10 GHz.

10. The wireless communication device of claim 9, wherein the DPD feedback circuit comprises:
    an attenuator for each of the plurality of RF PAs to normalize isolation loss between polarizations of each of the dual polarized antennas; and
    a combiner to sum the detected output samples of the plurality of RF PAs into the DPD feedback signal after attenuation.

11. The wireless communication device of claim 9, wherein the dual polarization antennas in the phased array each include a horizontal polarization for transmission and a vertical polarization for sampling one of each the detected output samples combined into the DPD feedback signal.

12. A method for wireless communication, the method comprising:
    detecting a power amplified (PA) signal from outputs of each power amplifier (PA) of a plurality of amplifiers (PAs) operating in a multi-stream transmit mode;
    combining the detected PA signals into a single digital pre-distortion (DPD) feedback signal;
    communicating the combined single DPD feedback signal to a digital processing unit;

selecting a magnitude and phase correction for pre-distorting each of the power amplifiers based on the single combined DPD feedback signal; and applying the selected magnitude and phase corrections to each PA relevant to the combined single DPD feedback signal, wherein a dual polarized antenna is coupled to an output of each PA, the dual polarized antenna having a first polarization for transmitting each PAs output signal, and a second polarization for receiving, and wherein detecting comprises using the second polarization for receiving to detect the power amplified signal transmitted from the first polarization for transmitting on the same dual polarized antenna.

13. The method of claim 12, wherein the detecting comprises using a dedicated DPD analog detector to sample the output signals of each of the plurality of PAs for combining.

14. The method of claim 13, wherein the dedicated DPD analog detector comprises a dedicated antenna proximate transmitting antennas.

15. The method of claim 13, wherein the dedicated DPD analog detector comprises:
   a power detector (PD) coupled to the outputs of the PAs operating in the multi-stream transmit mode; and
   an attenuator to calibrate mismatch, if any, from the coupled PD path from each PA.

16. The method of claim 13, wherein communicating the combined DPD feedback signal to the digital processing unit comprises:
   mixing the combined DPD feedback signal at a frequency other than a data transmit or receive frequency, and
   transmitting the mixed DPD feedback signal over a coaxial connection to a baseband processing module.

* * * * *